United States Patent [19]
Buchanan

[11] 3,943,500
[45] Mar. 9, 1976

[54] SEVEN-SEGMENT DISPLAY ARRANGEMENT AND LIQUID FUEL DISPENSING PUMP EMBODYING THE SAME

[75] Inventor: Donald George Buchanan, Bottisham, England

[73] Assignee: Dresser Europe S.A., Brussels, Belgium

[22] Filed: May 2, 1974

[21] Appl. No.: 466,517

[52] U.S. Cl. .............................. 340/253 R; 340/336
[51] Int. Cl.² .......................................... G09F 9/32
[58] Field of Search ............ 340/324 R, 336, 253 R, 340/253 A, 253 B, 253 E

[56] References Cited
UNITED STATES PATENTS

| | | | |
|---|---|---|---|
| 3,139,753 | 7/1964 | Brudner | 340/324 R |
| 3,548,403 | 12/1970 | Johnson | 340/324 R |
| 3,580,421 | 5/1971 | Bickford | 340/336 |
| 3,581,308 | 5/1971 | McNaney | 340/336 |

*Primary Examiner*—Marshall M. Curtis
*Attorney, Agent, or Firm*—William E. Johnson, Jr.

[57] ABSTRACT

A seven-segment display arrangement has one or more seven-segment display devices each with a common anode and a cathode for each segment, and a diode connected to each cathode is arranged so that on failure of a segment the cathode current is drawn by the diode and is used to initiate a warning signal. Principal application for the display is in a liquid fuel dispenser where the display may be mounted in encapsulated form on the dispensing nozzle.

10 Claims, 4 Drawing Figures

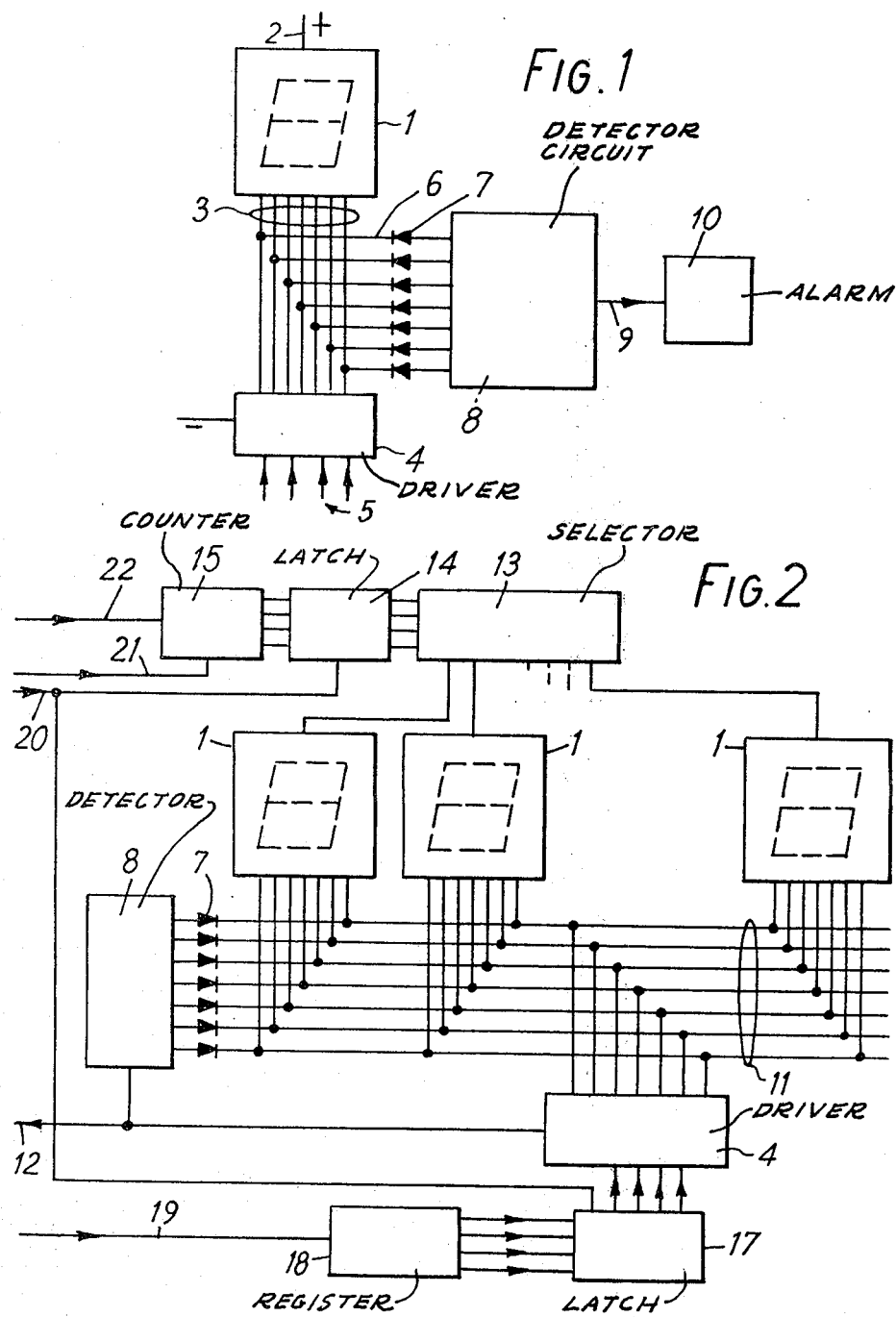

SEVEN-SEGMENT DISPLAY ARRANGEMENT AND LIQUID FUEL DISPENSING PUMP EMBODYING THE SAME

The invention relates to a seven-segment electronic display arrangement and is concerned in one aspect particularly with means for detecting failure of a seven-segment display device. Another aspect of the invention is concerned with a liquid fuel dispensing pump embodying a seven-segment electronic display.

A seven-segment display device, which may be a solid state device, has seven segments each of which has an anode and is illuminated when current is passed between the anode and the cathode. For convenience the anodes or the cathodes of all the segments are connected to a common terminal and selective illumination of the segments is effected by selectively applying cathode potentials to the different cathodes or anode potentials to the different anodes as the case may be. Exclusive reference will be made hereinafter to a common anode device, but it is to be understood that the invention applies equally to a common cathode device, references to "anode" and "cathode" being interchangeable as appropriate.

Failure of one or more of the segments of a seven-segment device may not be immediately apparent by observation, since the device will merely give a wrong numerical output. In some applications, particularly for retail sale indications, for example, it is important and possibly legally required that erroneous indications should not go undetected. The invention seeks to provide an arrangement in which failure in a seven-segment device will be detected.

According to one aspect of the invention there is provided a seven-segment display arrangement comprising a seven-segment display device having a common anode and a cathode for each segment, a cathode driver connected to each cathode for supplying cathode surrent to the appropriate segment when energised, a circuit connection including a series diode connected to each cathode, a detector circuit connected to the circuit connections so as to draw current through the respective diode from the respective cathode driver in the event of a segment failure of the device, and an output from the detector circuit connected to give a warning indication on receipt of current through a diode.

The output from the detector circuit may be connected simply to a visible and/or audible warning device. However, instead, or preferably in addition, the output is connected to energise all the cathode drivers on detection of a current through a diode. In this way the indication given by the device will be maintained as a fixed number which should be 8 because of the failed segment.

A preferred embodiment of the invention comprises a plurality of seven-segment devices of which respective cathodes are connected in common to the cathode drivers and to the circuit connections. With this arrangement, energisation of all the cathode drivers simultaneously will give indications of 8 on all the devices except the device at fault.

A feature of the invention is the provision of means for activating a multi-digital display of the seven-segment kind in a time-division multiplex manner. To this end, each display device has a respective anode driver and the anode drivers are energised cyclically in turn so that only one device is operative at any one time. There is a set of common cathode drivers each connected to respective cathodes of the display devices. The pattern of potentials applied by the common cathode drivers is altered sequentially in synchronism with the cycling of the anode drivers so that as each set of common anodes of a device is energised, the cathodes of that device are energised to give the appropriate digital display. Furthermore, the cathode pattern may be established by the output from a binary register/decoder combination which is set for each digit by a train of binary pulses. In this way all the display device can be controlled remotely over only four control wires. One additional wire is necessary for the warning signal from the failure detector.

The invention has particular application in giving indications for liquid fuel dispensing pumps in, for example, a petrol station. Thus, in accordance with a feature of the invention it is proposed to indicate fuel sales information such as volume of fuel, cost of fuel and/or unit price of fuel by means of an array of seven-segment devices having a segment failure arrangement as described above. The display for each fuel pumpmay be in the pump body and is preferably duplicated at a central control where a cashier is situated to accept payment. The time-division multiplex system described above is particularly useful for conveying the information to be displayed in a time-sharing manner from the dispensing pumps to the central control with the minimum of inter-connecting wires. The invention further contemplates an improved display for a liquid fuel dispensing pump.

According to another aspect of the invention a display for displaying sales information in a liquid fuel dispensing pump comprises an array of seven-segment electronic display devices, there being one device for each digit of information to be displayed, the array being mounted on the handle of the fuel pump nozzle. With this arrangement the display is readily observed by the operator as dispensing is taking place. The display may be duplicated by a similar array of seven-segment devices is the pump body and/or at a central control.

In the interests of safety the display on the nozzle handle is preferably totally encapsulated in a block having at least a transparent face through which the display can be observed. Preferably the display is controlled in a time-division multiplex manner over four wires in the manner described above. Preferably a segment failure detector arrangement is provided, as described above.

The invention will further be described with reference to the accompanying drawings, of which:

FIG. 1 is a circuit diagram of a display arrangement in accordance with the invention;

FIG. 2 is a circuit diagram of another display arrangement in accordance with the invention as applied to a liquid fuel dispensing system;

Figure 3:
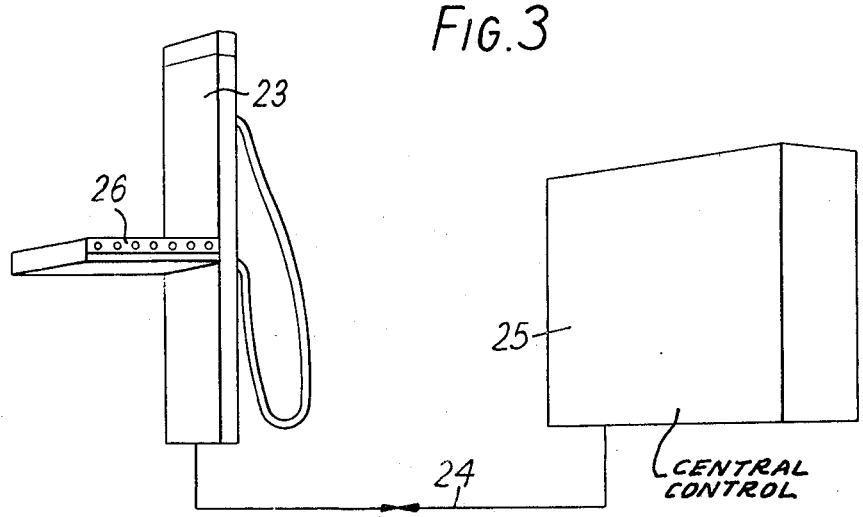
FIG. 3 is a schematic diagram of the dispensing system of FIG. 2.

Referring to FIG. 1 there is shown a display arrangement which comprises a seven-segment display device 1 of which the segments have a common anode 2. The segments have respective cathodes 3 which are driven by respective cathode drivers in a driver unit 4. The driver unit 4 includes a decoder and accepts input signals on four input terminals 5 which determine the pattern of output potentials applied to the cathodes 3. The segments illuminated and thus the number indicated is accordingly determined by the input on terminals 5.

Each cathode is connected to a respective circuit connection such as that shown at 6 and each circuit connection includes a series diode such as that shown at 7. The diodes are connected to inputs of a detector circuit 8. If a segment of the device 1 should fail this would mean that when a cathode potential is applied to the respective cathode 3 no current would be drawn through the device via that cathode. Under these circumstances, the cathode current is drawn through the respective diode 7 and is detected by the detector circuit 8. On receipt of such a current the detector circuit energises an output 9 which is connected to an alarm 10 to give an audio and/or visual alarm.

Referring now to FIG. 2 there is shown a display arrangement which is a development of that of Figure1 and which includes thirteen seven-segment display devices 1, of which only three are shown. A common cathode driver unit and decoder 4 is provided for all the display devices 1, the cathodes being connected to respective members of a set of lines 11 which are energised by the unit 4. The lines 11 are equivalent to the circuit connections 6 of FIG. 1 and diodes 7 are provided as described, connected to the inputs of a detector unit 8. If any one of the segments of any of the seven-segment devices 1 fails, a current will be drawn through a diode 7 and will be detected by circuit 8. As a result, an output signal will be applied over a line 12 to an alarm unit (not shown). Also, the output signal will be applied to the driver unit 4 in such a way as to apply cathode potential to all outputs of the driver unit. This means that all of the lines 11 will receive cathode potential and each display device will show the numeral 8 with the exception of the device which is at fault.

The arrangement of FIG. 2 is specifically designed for use as a display array in the nozzle handle of a liquid fuel dispensing pump. The display is for showing the volume of fuel dispensed, the cost of fuel as it is dispensed and the selected unit price of the fuel. To this end there are 13 digits of the display and there are accordingly 13 display devices 1.

In order to reduce the number of control lines necessary to effect the display of 13 digits a time-division multiplex display system is employed. To this end, each of the display devices 1 receives anode potential from a selector circuit 13 which is controlled by a latch 14 and a four bit counter 15 so that the display devices are "enabled" by provision of an anode potential in turn in cyclic sequence.

In order to display the appropriate numeral in each display device the driver unit 4 is controlled by a latch 17 which is set by a four bit register 18 in synchronism with the cyclic display sequence. Thus, when a particular display device receives an energising anode potential, the cathode potential pattern which is applied to the cathodes of the device is appropriate to give the required indication. Controlling signals for the numerals are applied over a line 19 in serial binary digital form. Latching signals are provided over an input line 20 and display device selector signals are applied over an input 21. An input line 22 is for clearing the counter 15. It will be seen that in addition to the fault signal line 12, there are only four input lines to control the thirteen display devices. This is convenient in this particular arrangement since the number of input lines should be kept to a minimum because of safety requirements and also because of the space available for the input lines is small.

FIG. 3 shows a general arrangement of a petrol filling station embodying a petrol pump having the display arrangement of FIG. 2. There are a number of similar petrol pumps in the station but for convenience only one is shown at 23. All the pumps are connected by a common data transmission link 24 to a central control 25 where a cashier is stationed to collect cash at the end of each transaction. The pump 23 has a display 26 mounted on the body of the pump and this display is a 13-character display of the kind mentioned with reference to FIG. 2. However, it is additional to a display on the pump nozzle handle. Also, the display is duplicated at the central control 25 where, again, there are shown the 13 digits appropriate to the current dispensing operation. This information is conveyed over the common data link 24 in a time division multiplex manner by serial binary digital signals. Each pump is interrogated in turn by the central control and delivers the required information as a result of the interrogation. This serial information is processed in the central control 25 in the same manner as described with reference to FIG. 2 to give the required display.

Figure 4:
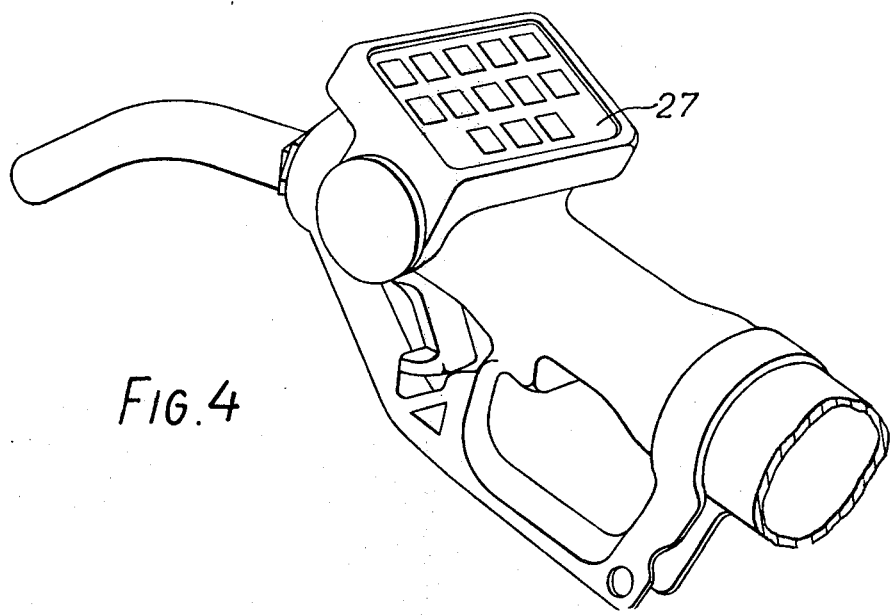
FIG. 4 is a perspective view of the nozzle of a dispensing pump embodying the invention.

Referring now to FIG. 4 there is shown the nozzle of the pump 23 of FIG. 3. The nozzle has a handle on which is mounted the seven-segment display array. The array is totally encapsulated in a transparent epoxy resin block 27. The display shows the current volume of fuel as it is dispensed, the total price as it is dispensed and the cost per unit volume of the fuel chosen. A heat sink (not shown) is incorporated in the block 27 in order to dissipate the heat generated by the seven-segment display devices. The five lines necessary for the display and alarm signals are included in a cable (not shown) which runs along the pump hose.

I claim:

1. A seven-segment display arrangement comprising a seven-segment display device having a common anode and a cathode for each segment, a cathode driver connected to each cathode for supplying cathode current to the appropriate segment when energised, a circuit connection including a series diode connected to each cathode, a detector circuit connected to the circuit connections so as to draw current through the respective diode from the respective cathode driver in the event of a segment failure of the device, and an output from the detector circuit connected to give a warning indication on receipt of current through a diode.

2. A seven-segment display arrangement as claimed in claim 1 wherein the output from the detector circuit is connected to energise all the cathode drivers on detection of a current through a diode.

3. A seven-segment display arrangement as claimed in claim 1 including at least one further seven segment display device, respective cathodes of the display devices being connected in common to the cathode drivers and to the circuit connections.

4. A seven-segment display arrangement as claimed in claim 3 wherein each display device has a respective anode driver and time-division multiplex means are provided to energise the anode drivers in cyclic sequence and also to alter the pattern of potentials applied by the common cathode drivers sequentially in synchronism with the cycling of the anode drivers so that as each set of common anodes of a device is energised, the cathodes of that device are energised to give the appropriate digital display.

5. A seven-segment display arrangement as claimed in claim 3 in a liquid fuel dispensing pump, the pump including means responsive to the quantity of fuel dispensed by the pump and the unit price of the fuel to drive the display devices to give indications of the volume dispensed and the cost of the fuel dispensed.

6. A seven-segment display arrangement as claimed in claim 5 wherein the pump has a delivery nozzle with a handle, and the display arrangement is mounted on the nozzle handle.

7. A seven-segment display arrangement as claimed in claim 6 in which the display on the nozzle handle is totally encapsulated in a block having at least a transparent face through which the display can be observed.

8. A seven-segment display arrangement for displaying sales information in a liquid fuel dispensing pump, the pump having a dispensing nozzle with a handle and the display arrangement comprising an array of seven-segment electronic display devices, there being one device for each digit of information to be displayed, the array being mounted on the handle of the fuel pump nozzle.

9. A seven-segment display arrangement as claimed in claim 8 wherein the display on the nozzle handle is totally encapsulated in a block having at least a transparent face through which the display can be observed.

10. A seven-segment display arrangement comprising a plurality of seven-segment display devices each having a common anode and a plurality of cathodes, an anode driver for each display device, a set of common cathode drivers each connected to respective cathodes of the display devices and time division multiplex means are provided to energise the anode drivers in cyclic sequence and also to alter the pattern of potentials applied by the common cathode drivers sequentially in synchronism with the cycling of the anode drivers so that as each set of common anodes of a device is energised, the cathodes of that device are energised to give the appropriate digital display.

* * * * *

UNITED STATES PATENT AND TRADEMARK OFFICE
CERTIFICATE OF CORRECTION

PATENT NO. : 3,943,500
DATED : March 9, 1976
INVENTOR(S) : Donald George Buchanan It is certified that error appears in the above–identified patent and that said Letters Patent are hereby corrected as shown below:

On the front page add:

"[30]     Foreign Application Priority Data
     May 3, 1973    Great Britain...........21139/73"

*Signed and Sealed this*

*twenty-second* Day of *June 1976*

[SEAL]

*Attest:*

RUTH C. MASON
*Attesting Officer*

C. MARSHALL DANN
*Commissioner of Patents and Trademarks*